United States Patent [19]
Murakami et al.

[11] Patent Number: 5,189,316
[45] Date of Patent: Feb. 23, 1993

[54] STEPDOWN VOLTAGE GENERATOR HAVING ACTIVE MODE AND STANDBY MODE

[75] Inventors: Shuji Murakami; Kazuyasu Fujishima, both of Hyogo, Japan

[73] Assignee: Mitsubishi Denki Kabushiki Kaisha, Tokyo, Japan

[21] Appl. No.: 706,925

[22] Filed: May 31, 1991

[30] Foreign Application Priority Data

Jun. 14, 1990 [JP] Japan ................ 2-157902

[51] Int. Cl.[5] .............................. H03K 3/01
[52] U.S. Cl. ....................... 307/296.1; 307/296.6; 307/359; 323/314
[58] Field of Search ............... 307/296.3, 296.1, 296.6, 307/296.8, 303, 304, 571, 358, 359, 264; 323/314

[56] References Cited

U.S. PATENT DOCUMENTS

| | | | |
|---|---|---|---|
| 4,649,291 | 3/1987 | Konishi | 307/297 |
| 4,691,123 | 9/1987 | Hashimoto | 307/296.3 |
| 4,724,339 | 2/1988 | Ishida | 307/355 |
| 4,833,341 | 5/1989 | Watanabe et al. | 307/296.1 |

OTHER PUBLICATIONS

"VLSI-Oriented Voltage Down Converter with Sub-Main Configuration", Takayasu Sakurai et al., 16th Int. Conf. Solid State Devices and Materials (1984) Kobe, Aug. 30–Sep. 1, pp. 74-75.

Furuyama et al., "A New On-Chip Voltage Converter for Submicrometer High-Density DRAM's," *IEEE Journal of Solid-State Circuits*, vol. SC-22, No. 3, Jun. 1987, pp. 437-441.

Hayakawa et al., "A Process-Insensitivity Voltage Down Converter Suitable for Half-Micron SRAM's," 1988 *Symposium on VLSI Circuits*, Digest of Technical Papers, Aug. 1988, pp. 53-54.

Horiguchi et al., "Dual-Operating-Voltage Scheme for a Single 5-V 16-Mbit DRAM," *IEEE Journal of Solid-State Circuits*, vol. 23, No. 5, Oct. 1988.

Primary Examiner—William L. Sikes
Assistant Examiner—Toan Tran
Attorney, Agent, or Firm—Lowe, Price, LeBlanc & Becker

[57] ABSTRACT

In an active mode, a transistor 61 or 63 is turned on, so that a reference voltage generator circuit 1 and an internal voltage correcting circuit 2 are activated. Consequently, an internal voltage $V_{INT}$ which is stepped down is applied to an internal main circuit 7. Conversely, in a standby mode, a transistor 61 or 63 is turned off, so that the reference voltage generator circuit 1 and the internal voltage correcting circuit 2 are inactivated. Consequently, the current does not flow in the reference voltage generator circuit 1 and the internal voltage correcting circuit 2, resulting in reduction of a consumption power. Simultaneously, a transistor 62 or 64 is turned on, so that a source voltage Ext.Vcc is directly applied to the internal main circuit 7 through the transistor 62 or 23. Thereby, operation conditions of logic circuits in the internal main circuit 7 are maintained.

2 Claims, 5 Drawing Sheets

STEPDOWN VOLTAGE GENERATOR HAVING ACTIVE MODE AND STANDBY MODE

BACKGROUND OF THE INVENTION

1. Field of the Invention

The present invention relates to a semiconductor integrated circuit device, and particularly to a semiconductor integrated circuit device provided with an internal stepdown circuit for stepping down a supply voltage applied from an external power supply.

2. Description of the Prior Art

In semiconductor memory devices such as dynamic random access memories (DRAMs) and static random access memories (SRAMs), reduction in size has been done to improve the degree of integration, and thus sizes of transistors have been extremely reduced. For instance, DRAMs of 16M bits or SRAMs of 4M bits have used the transistors in the order of 0.5 μm. However, if such small transistors were used under a standard supply voltage of 5 V, an excessive electric field would be applied to the transistors, and thus a reliability would not be ensured due to problems such as hot electrons.

Accordingly, there has been such attempts that an internal stepdown circuit is arranged in the semiconductor integrated circuit device so as to step down an external voltage by the internal stepdown circuit before it is supplied to internal circuits, and thus to reduce the electric field applied to the minute transistors.

FIG. 5 is a circuit diagram illustrating a conventional internal stepdown circuit disclosed, for instance, in "A New On-Chip Voltage Converter for Submicrometer High-Density DRAM's" (Journal of Solid-State Circuits, Vol.SC-22, No. 3, June 1987, pp. 437-441). The illustrated internal stepdown circuit essentially consists of a reference voltage generator circuit 1 and an internal voltage correcting circuit 2. The reference voltage generator circuit 1 is adapted to generate a reference voltage $V_{REF}$ with respect to the internal voltage correcting circuit 2, and include P-type MOS transistors (will be called as "PMOS transistors" hereinafter) 1a-1e. The PMOS transistors 1a-1c are connected in series to each other and are interposed between a supply input terminal 3 and the ground GND. Specifically, the PMOS transistor 1a has a source connected to the supply input terminal 3. The PMOS transistor 1b has a source connected to a drain of the PMOS transistor 1a. The PMOS transistor 1c has a source connected to a drain of the PMOS transistor 1b. The PMOS transistor 1c has a drain connected to the ground GND. The PMOS transistor 1a has a gate connected to a source of the PMOS transistor 1b. The PMOS transistor 1b has a gate connected to a source of the PMOS transistor 1c. The PMOS transistor 1c has a gate connected to the ground GND. Thus, these PMOS transistors 1a-1c are used as resistors, respectively, and constitute a resistive potential divider circuit. The supply input terminal 3 receives a supply voltage Ext.vcc from an external power supply (not shown). Other PMOS transistors 1d and 1e are connected in series to each other, and are interposed between the supply input terminal 3 and the ground GND in parallel to the above PMOS transistors 1a-1c. Specifically, the PMOS transistor 1d has a source connected to the supply input terminal 3 and the PMOS transistor 1e has a source connected to a drain of the PMOS transistor 1d. The drain of the PMOS transistor 1e is connected to the ground GND. The gate of the PMOS transistor 1d is connected to the drain of the PMOS transistor 1b and the source of the PMOS transistor 1c. The gate of the PMOS transistor 1e is connected to the ground GND.

The internal voltage correcting circuit 2 is adapted to correct an internal voltage $V_{INT}$ based on the reference voltage $V_{REF}$ so as to prevent the fluctuation of the internal voltage $V_{INT}$ which may be caused by the fluctuation of the supply voltage Ext.Vcc, and is formed of a current quantity switching circuit 21, a voltage comparator circuit 22 and an output transistor 23. The current quantity switching circuit 21 is adapted to switch a current quantity supplied to the voltage comparator circuit 22 in accordance with switching between an active mode and a standby mode of the semiconductor integrated circuit device, and is formed of two PMOS transistors 21a and 21b interposed in parallel between the supply input terminal 3 and the voltage comparator circuit 22. The PMOS transistor 21a has a source connected to the supply input terminal 3 and a gate for receiving a clock signal φ. The PMOS transistor 21b has a source connected to the supply input terminal 3 and a gate connected to the ground GND. The voltage comparator circuit 22 is adapted to make a comparison between the reference voltage $V_{REF}$ applied from the reference voltage generator circuit 1 and the internal voltage $V_{INT}$ supplied from the output transistor 23 and to control a conductivity of the output transistor 23 in accordance with a result of the comparison, and is formed of two PMOS transistor 22a and 22b and two N-channel MOS transistors (will be called as "NMOS transistors" hereinafter) 22c and 22d. The PMOS transistor 22a has a source connected to the drains of the PMOS transistors 21a and 21b, a drain connected to a drain of the PMOS transistor 22c and a gate connected to the drain of the PMOS transistor 1d and the source of the PMOS transistor 1e. The PMOS transistor 22b has a source connected to the drains of the PMOS transistors 21a and 21b, a drain connected to a drain of the NMOS transistor 22d and a gate connected to the source of the output transistor 23. Sources of the NMOS transistors 22c and 22d are connected to the ground GND. Gates of the NMOS transistors 22c and 22d are commonly connected to the drain of the PMOS transistor 22b. Further, the drains of the PMOS transistor 22a and the NMOS transistor 22c are connected to the gate of the output transistor 23. The output transistor 23 is formed of a PMOS transistor of which source is connected to the supply input terminal 3.

The internal stepdown circuit of the prior art shown in FIG. 5 operates as follows.

First, operations of the reference voltage generator circuit 1 will be described below. The PMOS transistors 1a-1c are in resistance connection and are interposed between the supply input terminal 3 and the ground GND, so that a node P between the drain of the PMOS transistor 1b and the source of the PMOS transistor 1c has a potential of Ext.Vcc $-2 \times |V_{TP}|$, in which $V_{TP}$ is a threshold voltage of the PMOS transistor. Since the node P is also connected to the gate of the PMOS transistor 1d, the potential at the node P is also a gate potential in the PMOS transistor 1d. Therefore, a potential difference between the source and drain of the PMOS transistor 1d is not affected by the fluctuation of the supply voltage Ext.Vcc and always kept at a constant value ($=2 \times |V_{TP}|$). Thus, a saturation current Id flowing in the PMOS transistor 1d is always kept constant.

However, this saturation current Id does not flow into the voltage comparator circuit 22 and thus is entirely supplied to the PMOS transistor 1e. Accordingly, the current Ie flowing in this PMOS transistor 1e is always constant (Ie=Id). Since the potential at the drain of the PMOS transistor 1e is fixed to the ground potential of 0 V(zero volt), the potential at the source of the PMOS transistor 1e has a constant value ($=V_{REF}$) if the current Ie is constant. Therefore, the reference voltage generator circuit 1 will always generate the constant reference voltage $V_{REF}$.

Operations of the internal voltage correcting circuit 2 will be described below. When the semiconductor integrated circuit device provided with the internal stepdown circuit in FIG. 5 is in an active mode, the clock signal $\phi$ is at an "L" level. Therefore, the PMOS transistor 21a is kept ON in the active mode. Meanwhile, the PMOS transistor 21b is always in the ON state because its gate is connected to the ground GND. Therefore, both the PMOS transistors 21a and 21b are turned on in the active mode, and thus a large current is supplied to the voltage comparator circuit 22. The voltage comparator circuit 22 compares the reference voltage $V_{REF}$ with the internal voltage $V_{INT}$. When the voltage $V_{REF}$ becomes smaller than the voltage $V_{INT}$, for instance, due to the increase of the internal voltage $V_{INT}$ caused by the increase of the supply voltage Ext.Vcc or other reasons, the conductivity of the PMOS transistor 22b decreases. Correspondingly, the potential at the drain of the PMOS transistor 22b decreases, and thus the conductivity of the NMOS transistor 22c decreases. Consequently, the potential at the drain of the NMOS transistor 22c increases, resulting in reduction of the conductivity of the output transistor 23. Accordingly, the internal voltage $V_{VINT}$ decreases to the same value as the voltage $V_{REF}$ ($V_{INT}=V_{REF}$). Conversely, if the internal voltage $V_{INT}$ decreases smaller than the reference voltage $V_{REF}$($V_{REF}>V_{INT}$) controlling is carried out in a manner contrary to the above, and thus the internal voltage $V_{INT}$ is stably maintained at the reference voltage $V_{REF}$.

As described above, the internal stepdown circuit in FIG. 5 generates the internal voltage $V_{INT}$ independent of the supply voltage Ext.Vcc. This internal voltage $V_{INT}$ is applied to respective internal circuits in the semiconductor integrated circuit device.

When the semiconductor integrated circuit device provided with the internal stepdown circuit 2 in FIG. 5 is in a standby condition, the clock signal $\phi$ is at the "H" level and the PMOS transistor 21a is maintained in an OFF state. Consequently, the current quantity supplied from the current quantity switching circuit 21 to the voltage comparator circuit 22 is reduced, resulting in reduction of the consumption power in the standby mode.

As described above, the internal stepdown circuit of the prior art shown in FIG. 5 is intended to reduce the consumption power in the standby mode by setting the PMOS transistor 21a at the OFF state in the standby mode. However, even when the PMOS transistor 21a is turned off, a current is supplied to the voltage comparator circuit 22 in the standby mode through the PMOS transistor 21b, because this PMOS transistor 21b is turned on. Further, the internal stepdown circuit of the prior art shown in FIG. 5 has structures in which the current flows in the reference voltage generator circuit 1 even in the standby mode.

Therefore, the internal stepdown circuit of the prior art shown in FIG. 5 still has a serious problem that the consumption power cannot be sufficiently reduced.

SUMMARY OF THE INVENTION

Accordingly, it is an object of the invention to provide a semiconductor integrated circuit device comprising an internal stepdown circuit in which a consumption power is remarkably reduced in a standby mode.

A semiconductor integrated circuit device according to the invention comprises internal stepdown means for stepping down a supply voltage supplied by an external power supply, inactivating means for inactivating the internal stepdown means in a standby mode, and a supply voltage applying means for directly applying a supply voltage, which is supplied from the external power source, to a main circuit in the standby mode.

In the present invention, since the internal stepdown means is inactivated in the standby mode, a current does not flow in the internal stepdown means and thus a consumption power is remarkably reduced. Further, the supply voltage supplied from the external power supply is directly applied to the main circuit in the standby mode, so that respective logic circuits in the main circuit maintain operation conditions thereof.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
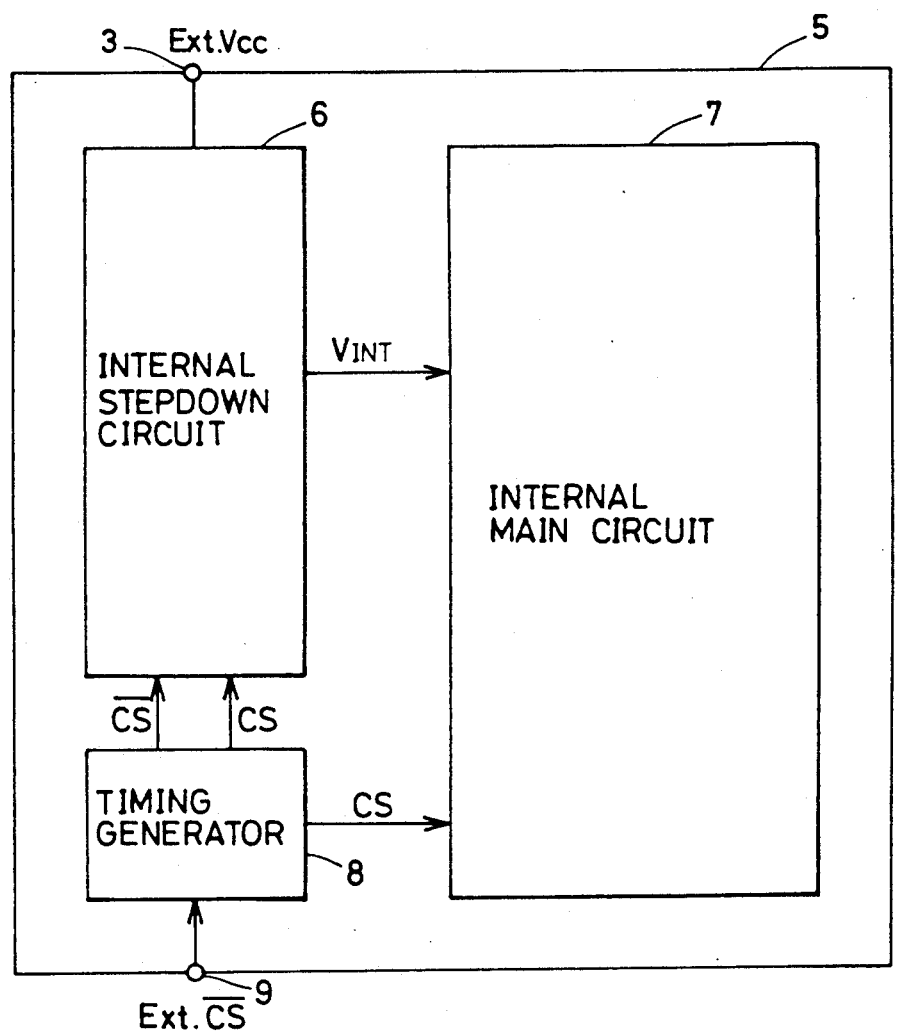
FIG. 1 is a schematic block diagram illustrating structures of an embodiment of the intention.

In FIG. 1, which is a schematic block diagram illustrating structures of an embodiment of the intention, a semiconductor substrate 5 includes an internal stepdown circuit 6, an internal main circuit 7 and a timing generator 8 formed thereon. The internal stepdown circuit 6 steps down a supply voltage Ext.Vcc supplied from an external power supply (not shown) through a supply input terminal 3 and generates an internal voltage $V_{INT}$, which is applied to the internal main circuit 7. The internal main circuit 7 includes various circuits such as a memory or memories, a gate array logic(s) and a microcomputer(s), which are selected in practice depending on a type of the semiconductor integrated circuit device. The timing generator 8 receives an external chip select signal Ext.$\overline{CS}$ through a mode signal input terminal 9 provided in the semiconductor substrate 5. This external chip select signal Ext.$\overline{CS}$ is a signal for switching an operation mode of the semiconductor integrated circuit device between an active mode and a standby mode. The timing generator 8 generates various timing signals CS and $\overline{CS}$ based on the external chip select signal Ext.$\overline{CS}$ applied thereto. These timing signals are applied to the internal stepdown circuit 6 and the internal main circuit 7.

Figure 2:
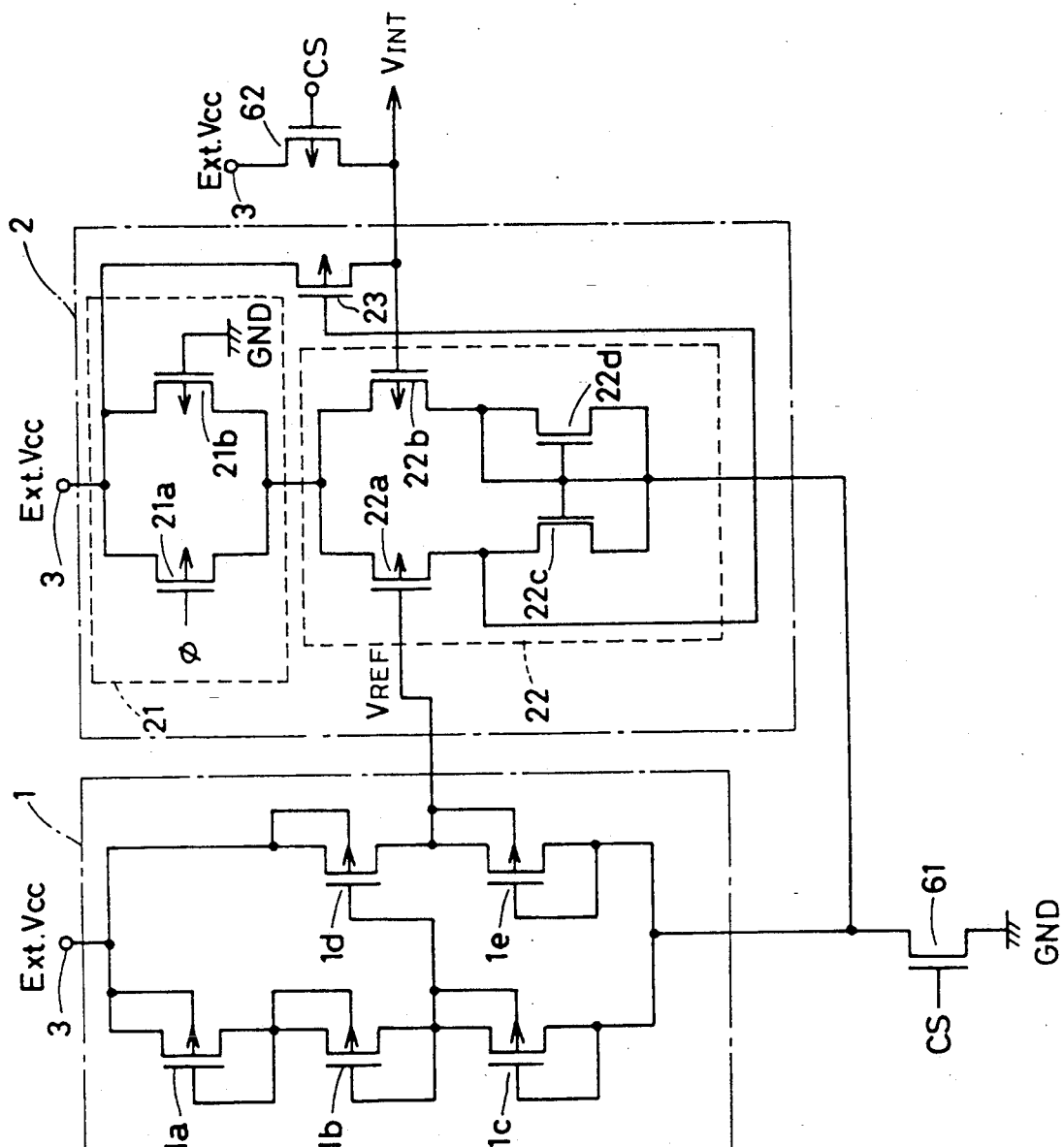
FIG. 2 is a circuit diagram illustrating an example of an internal stepdown circuit shown in FIG. 1.
Figure 5:
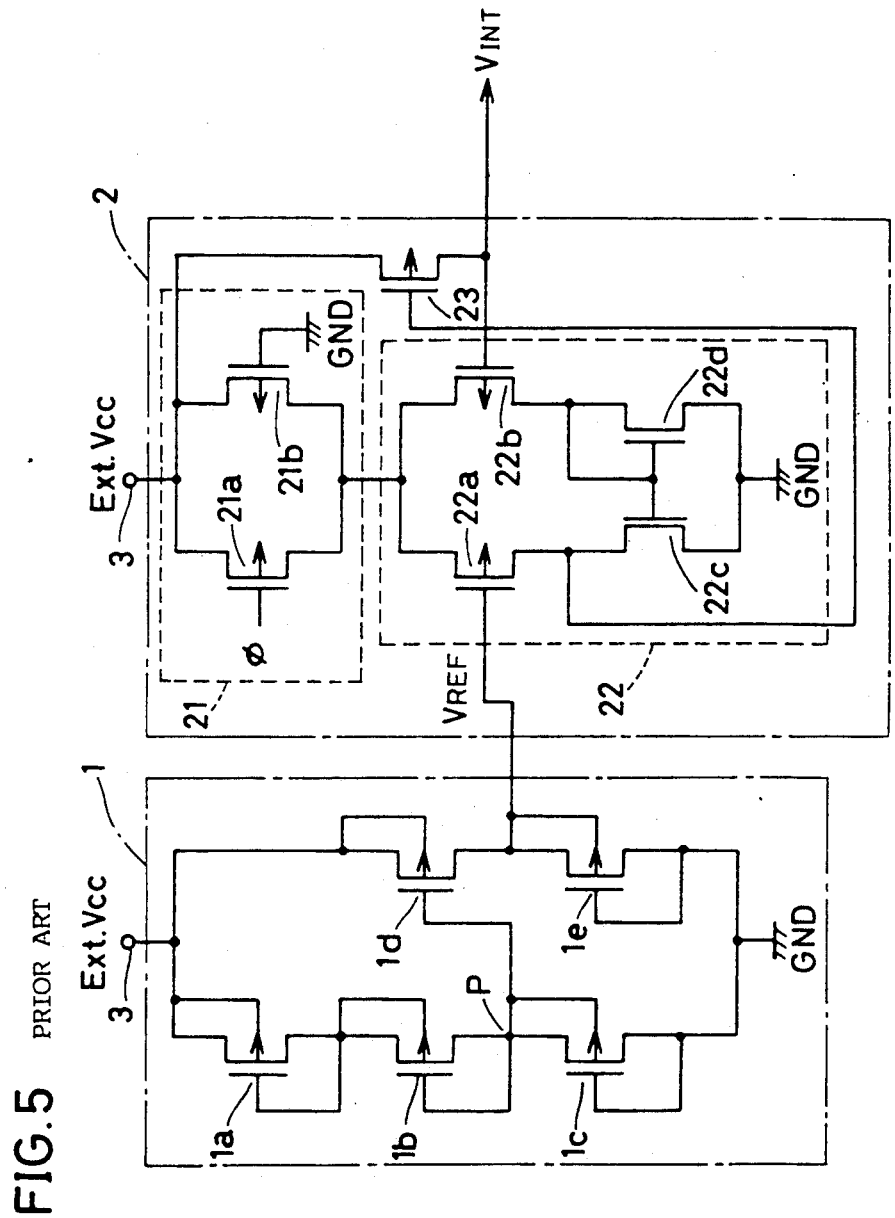
FIG. 5 is a circuit diagram illustrating a conventional internal stepdown circuit.

In FIG. 2, which is a circuit diagram illustrating an example of the internal stepdown circuit 6 shown in FIG. 1, the internal stepdown circuit illustrated therein includes the reference voltage generator circuit 1 and the internal voltage correcting circuit 2 similarly to the internal stepdown circuit of the prior art shown in FIG. 5. Further, the internal stepdown circuit in FIG. 2 includes an NMOS transistor 61 for inactivating the reference voltage generator circuit 1 and the internal voltage correcting circuit 2 in the standby mode, and also includes a PMOS transistor 62 for directly applying the supply voltage Ext.Vcc to the internal main circuit 7 in the standby mode. The NMOS transistor 61 has a drain connected to drains of the PMOS transistors 1c and 1e and to sources of the NMOS transistors 22c and 22d, and has a source connected to the ground GND. A gate of the NMOS transistor 61 receives a timing signal CS from the timing generator 8. The PMOS transistor 62 has a source connected to the supply input terminal 3 and a drain connected to the drain of the output transistor 23. A gate of the PMOS transistor 62 receives the timing signal CS from the timing generator 8. Other structures are the same as or similar to those of the internal stepdown circuit of the prior art shown in FIG. 5, and corresponding parts and members are denoted by the same reference numbers and are not described below.

Now, operations of the internal stepdown circuit shown in FIG. 2 will be described. In the active mode, the timing signal CS is at the "H" level. Therefore, the NMOS transistor 61 is turned on, and the PMOS transistor 62 is turned off. Accordingly, current paths are formed between the reference voltage generator circuit 1 and the ground GND, and between the internal voltage correcting circuit 2 and the ground GND, and both the reference voltage generator circuit 1 and the internal voltage correcting circuit 2 are activated. At this time, the reference voltage generator circuit 1 and the internal correcting circuit 2 perform completely same operations as those of the reference voltage generator circuit 1 and the internal voltage correcting circuit 2 in FIG. 5 in the active mode. That is, the reference voltage generator circuit 1 steps down the supply voltage Ext.Vcc to generate a reference voltage $V_{REF}$, and the internal voltage correcting circuit 2 corrects the fluctuation of the internal voltage $V_{INT}$ based on the reference voltage $V_{REF}$. In the standby mode, the timing signal CS is at the "L" level. Therefore, the NMOS transistor 61 is turned off, and the PMOS transistor 62 is turned on. Due to the OFF state of the NMOS transistor 61, the current path between on one hand the reference voltage generator circuit 1 and the internal voltage correcting circuit 2 and on the other hand the ground GND is shut off, and both the reference voltage generator circuit 1 and the internal voltage correcting circuit 2 are inactivated. Thus, the current does not flow in both the reference voltage generator circuit 1 and the internal voltage correcting circuit 2 in this condition, resulting in remarkable reduction of the power consumption in the standby mode. On the other hand, the PMOS transistor 62 is turned on, so that the supply voltage Ext.Vcc is directly applied thorough this PMOS transistor 62 to the internal main circuit 7, whereby the respective logic circuits in the internal main circuit 7 maintain the operation conditions thereof (e.g., storing of data in memories).

In the standby mode, since the current does not flow in almost every transistor in the internal main circuit 7, which is particularly remarkable in SRAMs, the respective transistors are in such a condition that hot electrons are hardly produced. Therefore, no problem is caused even if the supply voltage Ext.Vcc is directly applied to the internal main circuit 7 in the standby mode. The circuit structures can be simplified in such a design that the supply voltage Ext.Vcc is directly applied to the internal main circuit 7. Further, since the current hardly flows in the standby mode, the PMOS transistor 62 can have a small size.

Figure 3:
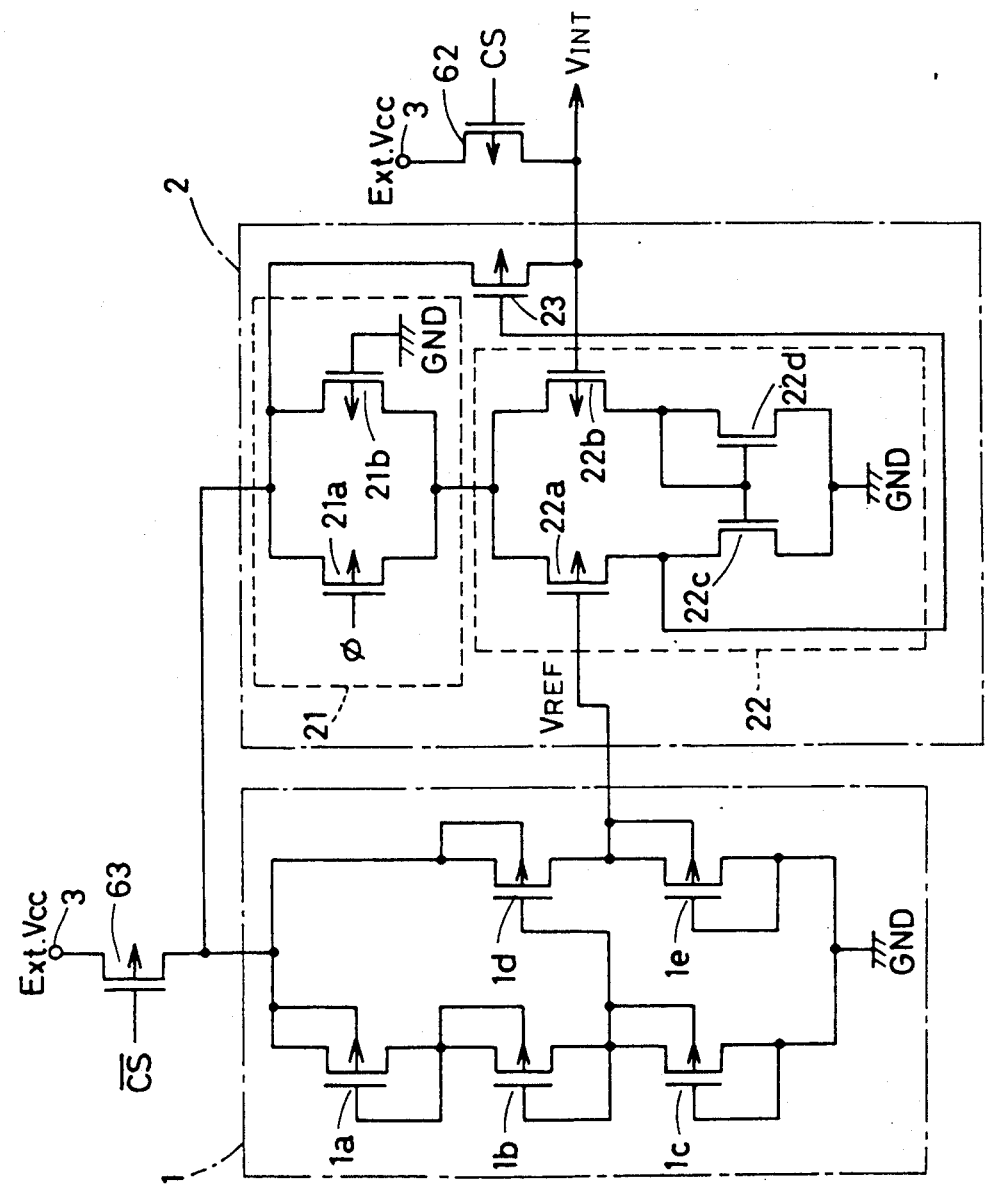
FIG. 3 is a circuit diagram illustrating another example of an internal stepdown circuit shown in FIG. 1.

FIG. 3 is a circuit diagram illustrating another example of the internal stepdown circuit 6 shown in FIG. 1. In the above described internal stepdown circuit shown in FIG. 2, the NMOS transistor 61 forming inactivating means is interposed between the ground GND and a node connecting the reference voltage generator circuit 1 and the internal voltage correcting circuit 2. Conversely, in the internal stepdown circuit shown in FIG. 3, a PMOS transistor 63 forming inactivating means is interposed between the power supply input terminal 3 and a node connecting the reference voltage generator circuit 1 and the internal voltage correcting circuit 2. Specifically, the PMOS transistor 63 has a source connected to the supply input terminal 3 and a drain connected to sources of the PMOS transistors 1a, 1d, 21a and 21b. Further, a gate of the PMOS transistor 63 receives an inverted signal $\overline{CS}$ of the timing signal CS from the timing generator 8. Other structures are same as or similar to those of the internal stepdown circuit shown in FIG. 2, and corresponding parts and members are denoted by the reference numbers and are not described below.

Now, operations of the internal stepdown circuit 2 shown in FIG. 3 will be described below. In the active mode, the timing signal $\overline{CS}$ is at the "L" level, and the timing signal CS is at the "H" level. Therefore, the PMOS transistor 62 is in the OFF state and the PMOS transistor 63 is in the ON state. Thus, the reference voltage generator circuit 1 and the internal voltage correcting circuit 2 are activated. Meanwhile, in the standby mode, the timing CS is at the "L" level, and the timing signal $\overline{CS}$ is at the "H" level. Therefore, the PMOS transistor 62 is in the ON state and the PMOS transistor 63 is in the OFF state. Therefore, the reference voltage generator circuit 1 and the internal voltage correcting circuit 2 are inactivated, and thus the current does not flow in these reference voltage generator circuit 1 and the internal voltage correcting circuit 2. Further, the supply voltage Ext.Vcc is directly applied from the supply input terminal 3 through the PMOS transistor 62 to the internal main circuit 7.

Figure 4:
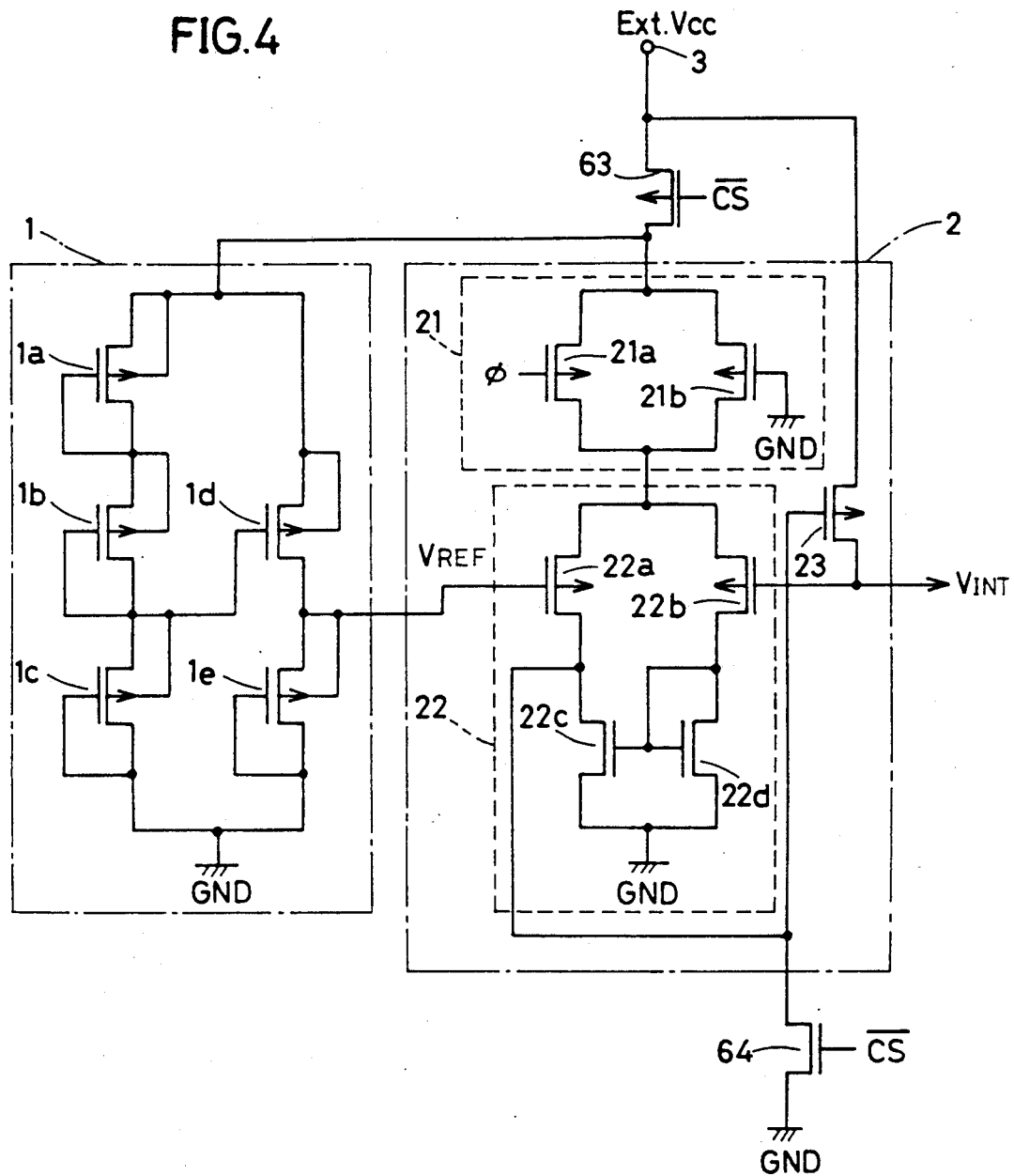
FIG. 4 is a circuit diagram illustrating still another example of an internal stepdown circuit shown in FIG. 1.

FIG. 4 is a circuit diagram illustrating still another example of the internal stepdown circuit 6 shown in FIG. 1. The internal stepdown circuits shown in FIGS. 2 and 3 are designed to apply the supply voltage Ext.Vcc to the internal main circuit 7 through the PMOS transistor 62 in the standby mode. Conversely, the internal stepdown circuit shown in FIG. 4 is designed to apply the supply voltage Ext.Vcc to the internal main circuit 7 through the output transistor 23 in the standby mode. For this purpose, the source of the output transistor 23 is directly connected to the supply input terminal 3. Further, a NMOS transistor 64 is interposed between the gate of the output transistor 23 and the ground GND. A gate of the NMOS transistor 64 is adapted to receive the timing signal $\overline{CS}$ from the timing generator 8. The timing signal $\overline{CS}$ is at the "H" level in the standby mode, whereby the PMOS transistor 63 is in the OFF state and the NMOS transistor 64 is in the ON state. Consequently, a current supply path to the reference voltage generator circuit 1 and the internal voltage correcting circuit 2 is shut off, and the reference voltage generator circuit 1 and the internal voltage correcting circuit 2 are inactivated. Further, the gate potential of the output transistor 23 equals to the ground potential, so that this output transistor 23 becomes completely conductive. Therefore, the supply voltage Ext.Vcc is directly applied to the internal main circuit 7 through the output transistor 23.

According to the invention, as described hereinabove, since the internal stepdown means is inactivated and the supply voltage is directly applied to the main circuit in the standby mode, the consumption power can be remarkably reduced in the standby mode, and the operation conditions of the respective logic circuits in the main circuit can be maintained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device for stepping down a supply voltage supplied from an external power supply to apply said supply voltage to a main circuit, having an active mode and a standby mode, comprising:

internal stepdown means for stepping down the supply voltage supplied by said external power supply and supplying an intermediate voltage to said main circuit;

inactivating means for inactivating said internal stepdown means in said standby mode; and supply voltage applying means for directly applying said supply voltage, which is supplied from said external power source, to said main circuit in said standby mode; and wherein said supply voltage applying means includes:

a first transistor element having a control electrode and being coupled between said external power supply and a supply input terminal of said main circuit, and a second transistor element coupled between said control electrode of said first transistor element and a reference potential source, performing a switching operation in response to a timing signal corresponding to a chip select signal.

2. A semiconductor integrated circuit device according to claim 1, wherein said first transistor element is used as an output transistor for outputting said intermediate voltage to said main circuit in said active mode.

* * * * *